United States Patent
Shi et al.

(10) Patent No.: US 11,101,399 B1
(45) Date of Patent: Aug. 24, 2021

(54) SINGLE-PHOTON DETECTOR HAVING MULTIPLE AVALANCHE LAYERS

(71) Applicant: National Central University, Taoyuan (TW)

(72) Inventors: Jin-Wei Shi, Taipei (TW); Yi-Shan Lee, Taoyuan (TW)

(73) Assignee: National Central University, Taoyuan (TW)

( * ) Notice: Subject to any disclaimer, the term of this patent is extended or adjusted under 35 U.S.C. 154(b) by 0 days.

(21) Appl. No.: 16/893,501

(22) Filed: Jun. 5, 2020

(51) Int. Cl.
*H01L 31/107* (2006.01)
*H01L 31/0304* (2006.01)

(52) U.S. Cl.
CPC ...... *H01L 31/107* (2013.01); *H01L 31/03046* (2013.01)

(58) Field of Classification Search
None
See application file for complete search history.

(56) References Cited

U.S. PATENT DOCUMENTS

| | | | | |
|---|---|---|---|---|
| 7,432,537 B1* | 10/2008 | Huntington | ............ | B82Y 20/00 257/186 |
| 9,466,751 B1* | 10/2016 | Shi | ........................ | H01L 31/107 |
| 2002/0074555 A1* | 6/2002 | Kim | ...................... | H01L 31/107 257/79 |
| 2004/0046176 A1* | 3/2004 | Kim | ..................... | H01L 31/0352 257/83 |
| 2017/0244002 A1* | 8/2017 | Campbell | ........... | H01L 31/1075 |
| 2019/0371956 A1* | 12/2019 | Shi | ................... | H01L 31/022408 |

OTHER PUBLICATIONS

"Very-Fast Timing Performance of InGaAs/InAlAs Single Photon Avalanche Diode with Dual Multiplication Layers" to Lee et. al, published in: 2020 Conference on Lasers and Electro-Optics (CLEO), and, date of conference: May 10-15, 2020 (Year: 2020).*
Liu, Mingguo et al. "High-Performace InGaAs/InP Single-Photon Avalance Photodiode" IEEE Journal of Selected Topics in Quantum Mechanics, vol. 13, No. 4, Jul./Aug. 2007.
Tosi, Alberto et al. "InGaAs/InP Single-Photon Avalanche Diode with Reduced Afterpulsing and Sharp Timing Response with 30 ps Tail" IEEE Journal of Quantum Electronics, vol. 48, No. 9, Sep. 2012.

* cited by examiner

*Primary Examiner* — Andres Munoz
(74) *Attorney, Agent, or Firm* — Demian K. Jackson; Jackson IPG PLLC

(57) ABSTRACT

A single-photon detector is provided. The detector has multiple avalanche layers. It has an avalanche photodiode (APD) structure using single photon. The APD is made of indium aluminum arsenide (InAlAs). At least two avalanche layers are designed. When the layer for avalanche is numbered only one and the gain is very big, the speed will be deteriorated very quickly. With the design of two avalanche layers in the present invention for the very big gain, the speed deterioration can be suppressed. After measuring, the present invention shows a faster speed as compared to prior arts. It proves that, by using more than two avalanche layers, the present invention effectively improves the feature of single-photon detector. Hence, the present invention is especially suitable for single-photon detection.

11 Claims, 4 Drawing Sheets

SINGLE-PHOTON DETECTOR HAVING MULTIPLE AVALANCHE LAYERS

TECHNICAL FIELD OF THE INVENTION

The present invention relates to a single-photon detector; more particularly, to forming at least two avalanche layers, where, with a very big gain, the deterioration speed is suppressed for improving the feature of the single-photon detector.

DESCRIPTION OF THE RELATED ARTS

Near infrared single-photon avalanche diode (SPAD) has shown its potential and capability of time-of-flight (ToF) measurement and faint light detection. As was revealed in "InGaAs/InP Single-Photon Avalanche Diode With Reduced Afterpulsing and Sharp Timing Response With 30ps Tail" by Alberto Tosi, Member, IEEE, Fabio Acerbi, Student Member, IEEE, Michele Anti, and Franco Zappa, Senior Member, IEEE (IEEE JOURNAL OF QUANTUM ELECTRONICS, VOL. 48, NO. 9, SEPTEMBER 2012 1227) and "High-Performance InGaAs/InP Single-Photon Avalanche Photodiode" by Mingguo Liu, Student Member, IEEE, Chong Hu, Xiaogang Bai, Member, IEEE, Xiangyi Guo, Joe C. Campbell, Fellow, IEEE, Zhong Pan, and M. M. Tashima, Member, IEEE (IEEE JOURNAL OF SELECTED TOPICS IN QUANTUM ELECTRONICS, VOL. 13, NO. 4, JULY/AUGUST 2007 887), the SPAD emerges as the most suitable single photon detector (SPD) for photon-counting and photon-timing applications such as eye-safe laser and 3-D optical ranging (LIDAR/LADAR), astrophysical observations, fluorescence lifetime imaging (FLIM), as well as quantum key distribution (QKD) and quantum computing. The photon-counting applications requires a SPD with high photon detection efficiency (PDE), low dark count rate (DCR) and low afterpulsing probability. For the photon-timing applications, besides the above requirements, an SPD with narrow timing response is demanded. A SPAD using InAlAs, instead of InP recently receives much interest due to its higher avalanche triggering probability, so a higher PDE is anticipated. In addition, the InGaAs/InAlAs SPAD exhibits better temperature stability than InGaAs/InP SPAD, which affords less stringent circuit requirements of voltage control and supply. However, as the thickness of multiplication layer increases, the afterpulsing effect and the timing jitter will get worse. Hence, the prior arts do not fulfill all users' requests on actual use.

SUMMARY OF THE INVENTION

The main purpose of the present invention is to form at least two avalanche layers, where, under a bias close to the breakdown voltage, a first M-layer begins to allow significant multiplication of gain and a second M-layer is avoided to be pushed into the deep breakdown area for operation with a very big gain; and, for the very big gain, the speed deterioration is suppressed. with the feature of single-photon detector effectively improved.

Another purpose of the present invention is to design at least two M-layers by splitting an M-layer into at least a first and a second M-layers, where the actually effective breakdown occurs only in an arear of 300 nm (i.e., the second M-layer); although the overall thickness of the whole M-layers is 500 nm (200 nm of the first M-layer together with 300 nm of the second M-layer), the breakdown field is effectively operated only in 300 nm of the second M-layer; the requirement of the whole thickness of M-layer is met yet the effective breakdown area is the second M-layer only, whose thickness is thinner for the whole structure; and, consequently, afterpulsing probability (APP) is suppressed and DCR is eliminated as well for effectively improving the feature of single-photon detector.

To achieve the above purpose, the present invention is a single-photon detector having multiple avalanche layers, comprising a P-type ohmic contact layer, an N-type ohmic contact layer, a P-type window layer, a first graded bandgap layer, an absorption layer, a second graded bandgap layer, a first P-type field control layer, a first multiplication layer (M-layer), a second P-type field control layer, a second M-layer, and an N-type contact layer, where the P-type ohmic contact layer is a first semiconductor $p^+$-doped; the N-type ohmic contact layer is a second semiconductor $n^+$-doped; the P-type window layer is a third semiconductor $p^+$-doped and disposed between the P-type ohmic contact layer and the N-type ohmic contact layer; the first graded bandgap layer is a fourth semiconductor $p^+$-doped and disposed between the P-type window layer and the N-type ohmic contact layer; the absorption layer is a fifth semiconductor undoped and disposed between the first graded bandgap layer and the N-type ohmic contact layer; the second graded bandgap layer is a sixth semiconductor undoped and disposed between the absorption layer and the N-type ohmic contact layer; the first P-type field control layer is a seventh semiconductor $p^-$-doped and disposed between the second graded bandgap layer and the N-type ohmic contact layer; the first M-layer is an eighth semiconductor undoped and disposed between the first P-type field control layer and the N-type ohmic contact layer; the second P-type field control layer is a ninth semiconductor $p^-$-doped and disposed between the first M-layer and the N-type ohmic contact layer; the second M-layer is a tenth semiconductor undoped and disposed between the second P-type field control layer and the N-type ohmic contact layer; the N-type contact layer is an eleventh semiconductor $n^-$-doped and disposed between the second M-layer and the N-type ohmic contact layer; from top to bottom, the single-photon detector has a structure comprising the P-type ohmic contact layer, the P-type window layer, the first graded bandgap layer, the absorption layer, the second graded bandgap layer, the first P-type field control layer, the first M-layer, the second P-type field control layer, the second M-layer, the N-type contact layer, and the N-type ohmic contact layer; the structure is an epitaxial-layers structure with an electrode of the M-layer being n-side down; a plurality of M-layers are obtained to increase a whole thickness of M-layer and operate a breakdown field in a restricted area of the second M-layer in an effective way; the requirement of the whole thickness of M-layer is met yet the effective area is restricted in the second M-layer as being relatively thin in the epitaxial-layers structure; and, thus, APP is suppressed and DCR is reduced. Accordingly, a novel single-photon detector having multiple avalanche layers is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

Figure 1:
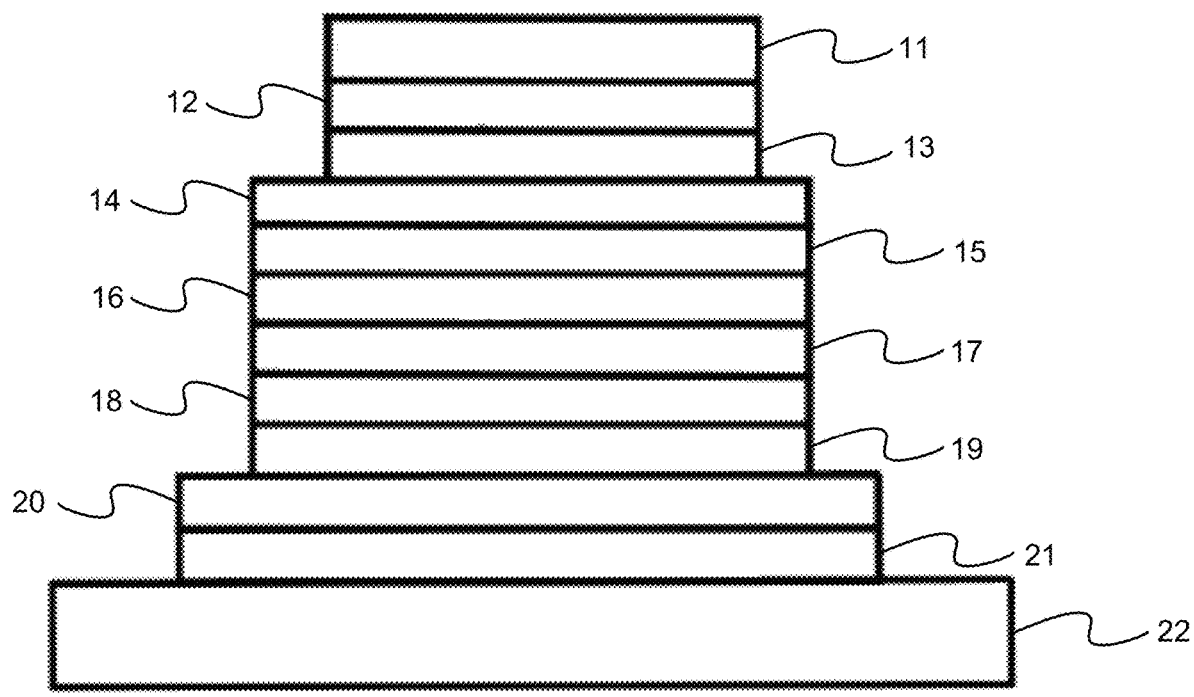
FIG. 1 is the sectional view showing the preferred embodiment according to the present invention.

The following description of the preferred embodiment is provided to understand the features and the structures of the present invention.

Please refer to FIG. 1 to FIG. 4, which are a sectional view showing a preferred embodiment according to the present invention; a view showing afterpulsing probabilities; a view showing timebase jitters; and a view showing dark count rates. As shown in the figures, the present invention is a single-photon detector having multiple avalanche layers, comprising, from top to bottom, a P-type ohmic contact layer 11, a P-type window layer 12, a first graded bandgap layer 13, an absorption layer 14, a second graded bandgap layer 15, a first P-type field control layer 16, a first multiplication layer (M-layer) 17, a second P-type field control layer 18, a second M-layer 19, an N-type contact layer 20, and an N-type ohmic contact layer 21. Therein, an epitaxial-layers structure is formed with an electrode of M-layer being n-side down; with a design of multiple M-layers, a whole thickness of M-layer is increased and a breakdown field is operated in a restricted area of the second M-layer 19 in an effective way; the requirement of the whole thickness of M-layer is met yet the effective area is restricted in the second M-layer 19 as being relatively thin in the epitaxial-layers structure; and, thus, APP is suppressed and DCR is eliminated.

The P-type ohmic contact layer 11 is of p+-doped indium gallium arsenide (InGaAs) and used as a P-type electrode. The P-type ohmic contact layer 11 may further comprise a P-type conductive metal layer (not shown in the figures), where the P-type ohmic contact layer 11 has a thickness of 100 nanometers (nm)±20 percent (%).

The P-type window layer 12 is of p+-doped indium aluminum arsenide (InAlAs) and folded between the P-type ohmic contact layer 11 and the N-type ohmic contact layer 21, where the P-type window layer 12 has a thickness of 300 nm±20%.

The first graded bandgap layer 13 is of p+-doped InGaAs or InAlAs and folded between the P-type window layer 12 and the N-type ohmic contact layer 21, where the first graded bandgap layer 13 has a thickness of 40 nm±20%.

The absorption layer 14 is of undoped InGaAs and folded between the first graded bandgap layer 13 and the N-type ohmic contact layer 21, where the absorption layer 14 has a thickness of 2000 nm±20%.

The second graded bandgap layer 15 is of undoped InGaAs and folded between the absorption layer 14 and the N-type ohmic contact layer 21, where the second graded bandgap layer 15 has a thickness of 40 nm±20%.

The first P-type field control layer 16 is of p−-doped InAlAs and folded between the second graded bandgap layer 15 and the N-type ohmic contact layer 21, where the first P-type field control layer 16 has a thickness of 30 nm±20%.

The first M-layer 17 is of undoped InAlAs and folded between the first P-type field control layer 16 and the N-type ohmic contact layer 21, where the first M-layer 17 has a thickness of 200 nm±20%.

The second P-type field control layer 18 is of p−-doped InAlAs and folded between the first M-layer 17 and the N-type ohmic contact layer 21, where the second P-type field control layer 18 has a thickness of 30 nm±20%.

The second M-layer 19 is of undoped InAlAs and folded between the second P-type field control layer 18 and the N-type ohmic contact layer 21, where the second M-layer 19 has a thickness of 300 nm±20%.

The N-type contact layer 20 is of n−-doped InAlAs and folded between the second M-layer 19 and the N-type ohmic contact layer 21, where the N-type contact layer 20 has a thickness of 100 nm±20%.

The N-type ohmic contact layer 21 is of n+-doped indium phosphide (InP), used as an N-type electrode, and may further comprise an N-type conductive metal layer (not shown in the figures), where the N-type ohmic contact layer 21 has a thickness of 800 nm±20%.

The epitaxial-layers structure 1 according to the present invention is grown on a semi-insulating or conductive semiconductor substrate 22, where the semiconductor substrate 22 is of an n−-doped compound, such as gallium arsenide (GaAs), gallium antimonide (GaSb), InP, or gallium nitride (GaN); or of an IV-group element, such as silicon (Si). Thus, a novel single-photon detector having multiple avalanche layers is obtained.

In a state-of-use, the P-type ohmic contact layer 11 is of p+-doped $In_xGa_{1-x}As$ and the absorption layer 14 is of undoped $In_xGa_{1-x}As$, where x is 0.53.

In a state-of-use, the P-type window layer 12 is of p+-doped $In_xAl_{1-x}As$, the first and the second P-type field control layers 16,18 are of p−-doped $In_xAl_{1-x}As$, the first and the second M-layers 17,19 are of undoped $In_xAl_{1-x}As$, and the N-type contact layer 20 is of n−-doped $In_xAl_{1-x}As$, where x is 0.52.

The epitaxial-layers structure 1 according to the present invention has a growth method unlimited, where preferred ones include molecular beam epitaxy (MBE), metalorganic chemical vapor deposition (MOCVD), and hydride vapor phase epitaxy (HVPE), for forming epitaxial layers on the semiconductor substrate 22.

For the consideration of reliability, the epitaxial-layers structure 1 with n-side down is used, where the strongest field of the first and the second M-layers 17,19 is folded in inner bottom layers to avoid surface breakdown. A plurality of M-layers are used in the present invention, where the increase in gain do not quicken the rate of deterioration and the feature of single-photon detector is thus effectively improved. Since the use of single avalanche layer with a very big gain quickly deteriorates the speed, the present invention uses a plurality of avalanche layers. For example, with the first and the second M-layers 17,19 under a bias close to the breakdown voltage (Vbr), the first M-layer 17 begins to allow significant multiplication of gain. This avoids pushing the second M-layer 19 into the deep breakdown area for an operation having a very big gain. Under a very big gain, the present invention suppresses the deterioration of speed and is especially suitable for single-photon detection.

Figure 2:
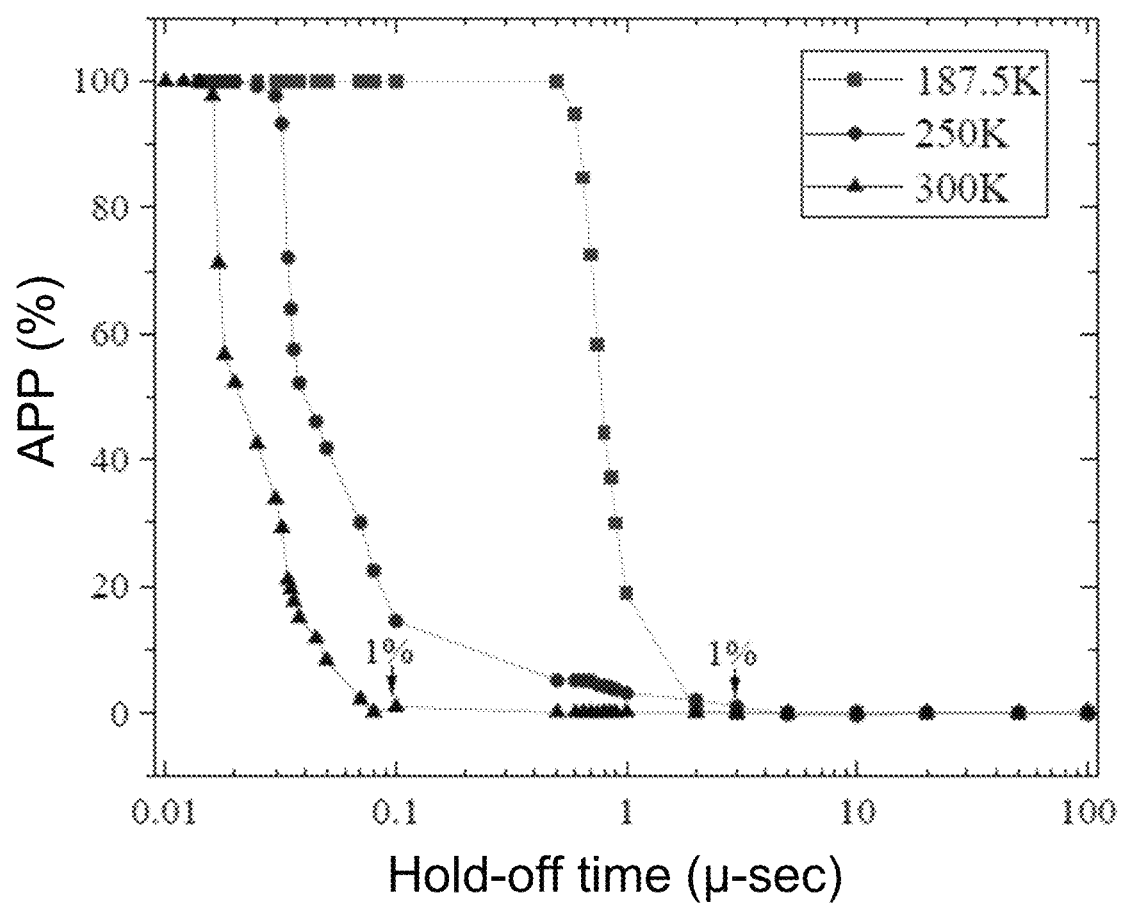
FIG. 2 is the view showing the afterpulsing probabilities (APP)

Although the requirement of M-layer is "the thicker, the better" for reducing DCR, the thicker layer follows with an increase in APP. Hence, the present invention splits M-layer into the first and the second M-layers 17,19 (as shown in FIG. 1), where, under a very big gain, the speed deterioration is suppressed. In FIG. 2, the vertical axis indicates APP and the horizontal axis indicates hold-off time. The figure shows the speed of device operation, where the longer the time, the slower the speed, and the faster the speed of device operation, the more serious the APP. As shown in FIG. 2, the epitaxial-layers structure 1 according to the present invention can be operated under a speed of 0.1 μ-sec with the effect of maintaining the APP below 1%. It means that less than 1% can be accomplished in a very short time.

Figure 3:
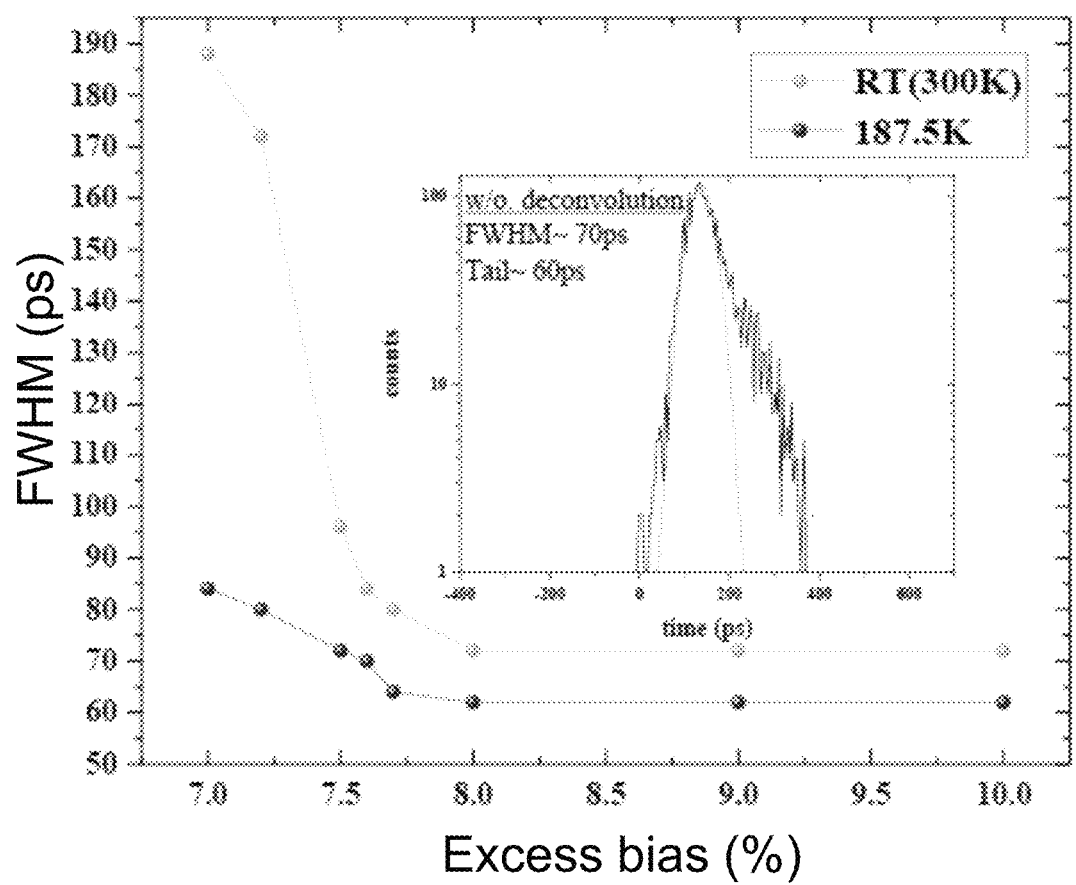
FIG. 3 is the view showing the timebase jitters.

Timebase jitters of the single-photon detector are shown in FIG. 3. The narrower the jitters shown in the figure, the better, which indicates a shorter time for a better performance. As shown in FIG. 3, according to the full width at half maximum (FWHM), the present invention can achieve less than 70 picoseconds (psec).

Figure 4:
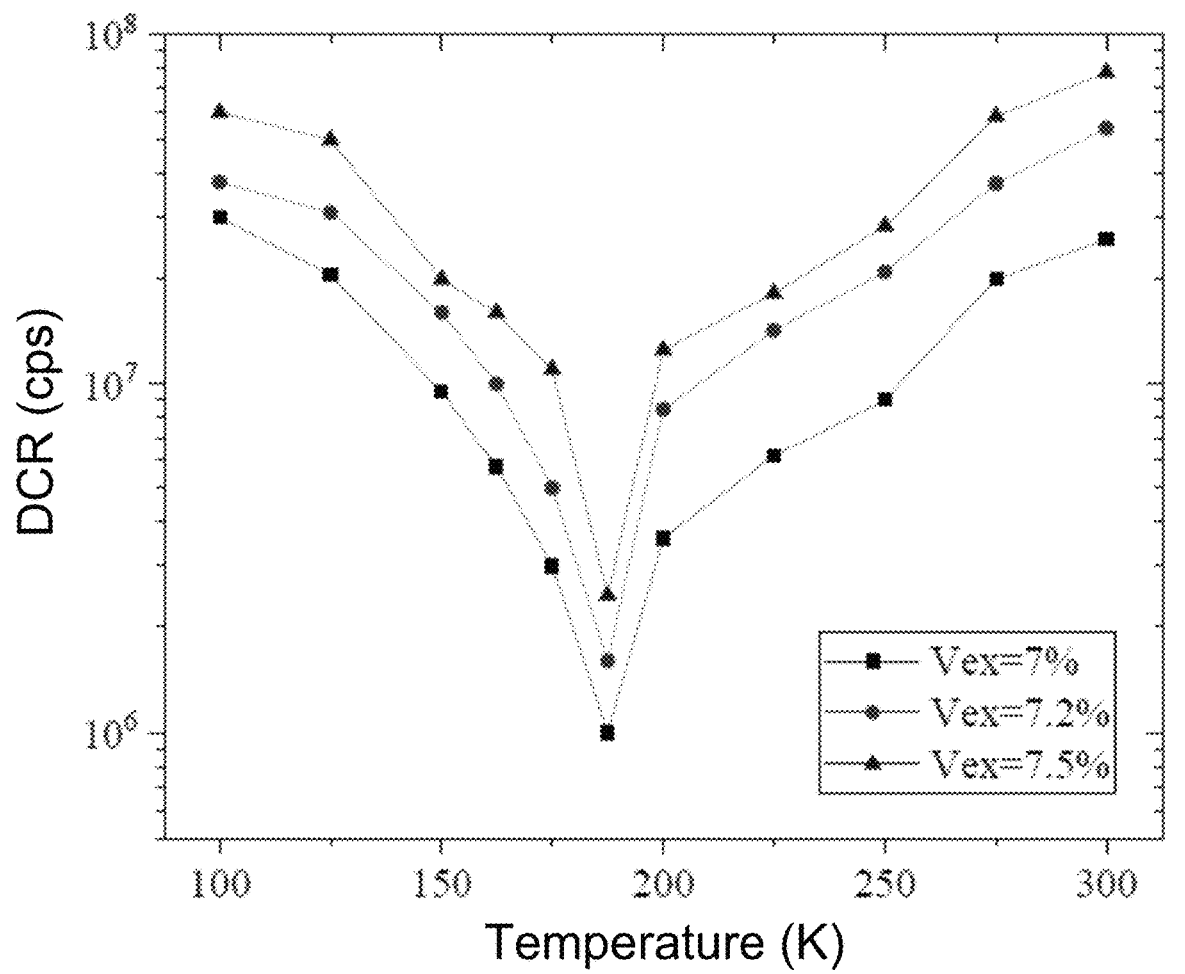
FIG. 4 is the view showing the dark count rates (DCR)

The DCRs of the single-photon detector are shown in FIG. 4. In FIG. 4, under the same DCRs, the present invention has a better performance of APP.

Hence, the present invention proposes a single-photon detector having multiple avalanche layers, where, with a design of multiple M-layers formed by splitting an M-layer into at least a first and a second M-layers, the actually effective breakdown occurs only in an arear of 300 nm (i.e., the second M-layer). It means that, although the overall thickness of the M-layers is 500 nm (200 nm of the first M-layer together with 300 nm of the second M-layer), the breakdown field is effectively operated only in 300 nm of the second M-layer 19. Thus, the thickness requirement of M-layer is met according to the present invention; yet the effective breakdown area is the second M-layer only, whose thickness is thinner for the whole structure. Consequently, APP is suppressed and DCR is eliminated as well for effectively improving the feature of single-photon detector.

To sum up, the present invention is a single-photon detector having multiple avalanche layers, where a plurality of M-layers are formed; with two layers, including a first and a second M-layers, under a bias close to the breakdown voltage, the first M-layer begins to allow significant multiplication of gain and the second M-layer is avoided to be pushed into the deep breakdown area for operation with a very big gain; for the very big gain, the present invention suppresses APP and eliminates DCR as well; and the speed deterioration is suppressed for effectively improving the feature of single-photon detector.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A single-photon detector having multiple avalanche layers comprising:
    a P-type ohmic contact layer being a first semiconductor $p^+$-doped;
    an N-type ohmic contact layer being a second semiconductor $n^+$-doped;
    a P-type window layer being a third semiconductor $p^+$-doped and disposed between said P-type ohmic contact layer and said N-type ohmic contact layer;
    a first graded bandgap layer being a fourth semiconductor $p^+$-doped and disposed between said P-type window layer and said N-type ohmic contact layer;
    an absorption layer being a fifth semiconductor undoped and disposed between said first graded bandgap layer and said N-type ohmic contact layer;
    a second graded bandgap layer being a sixth semiconductor undoped and disposed between said absorption layer and said N-type ohmic contact layer;
    a first P-type field control layer being a seventh semiconductor $p^-$-doped and disposed between said second graded bandgap layer and said N-type ohmic contact layer;
    a first multiplication layer (M-layer) being an eighth semiconductor undoped and disposed between said first P-type field control layer and said N-type ohmic contact layer;
    a second P-type field control layer being a ninth semiconductor $p^-$-doped and disposed between said first M-layer and said N-type ohmic contact layer;
    a second M-layer being a tenth semiconductor undoped and disposed between said second P-type field control layer and said N-type ohmic contact layer; and
    an N-type contact layer being an eleventh semiconductor $n^-$-doped and disposed between said second M-layer and said N-type ohmic contact layer, wherein, from top to bottom, the single-photon detector has a structure comprising said P-type ohmic contact layer, said P-type window layer, said first graded bandgap layer, said absorption layer, said second graded bandgap layer, said first P-type field control layer, said first M-layer, said second P-type field control layer, said second M-layer, said N-type contact layer, and said N-type ohmic contact layer forming an epitaxial-layers structure.

2. The single-photon detector according to claim 1, wherein said epitaxial-layers structure is grown on a semiconductor substrate selected from a group consisting of a semi-insulating semiconductor substrate and a conductive semiconductor substrate.

3. The single-photon detector according to claim 1, wherein said P-type ohmic contact layer is of $p^+$-doped indium gallium arsenide (InGaAs);
    said P-type window layer is of $p^+$-doped indium aluminum arsenide (InAlAs);
    said absorption layer is of undoped InGaAs;
    said first P-type field control layer is of $p^-$-doped InAlAs;
    said first M-layer is of undoped InAlAs; said second P-type field control layer is of $p^-$-doped InAlAs;
    said second M-layer is of undoped InAlAs;
    said N-type contact layer is of $n^-$-doped InAlAs; and
    said N-type ohmic contact layer is of $n^+$-doped indium phosphide (InP).

4. The single-photon detector according to claim 3, wherein said first graded bandgap layer is of a material selected from a group consisting of $p^+$-doped InGaAs and $p^+$-doped InAlAs and said second graded bandgap layer is undoped InGaAs.

5. The single-photon detector according to claim 3, wherein said P-type ohmic contact layer is of $p^+$-doped $In_xGa_{1-x}As$ and x is 0.53.

6. The single-photon detector according to claim 3, wherein said P-type window layer is of $p^+$-doped $In_xAl_{1-x}As$ and x is 0.52.

7. The single-photon detector according to claim 3, wherein said absorption layer is of undoped $In_xGa_{1-x}As$ and x is 0.53.

8. The single-photon detector according to claim 3, wherein said first and said second P-type field control layers are of $p^-$-doped $In_xAl_{1-x}As$ and x is 0.52.

9. The single-photon detector according to claim 3, wherein said first and said second M layers are of undoped $In_xAl_{1-x}As$ and x is 0.52.

10. The single-photon detector according to claim 3, wherein said N-type contact layer is of $n^-$-doped $In_xAl_{1-x}As$ and x is 0.52.

11. The single-photon detector according to claim 3, wherein said first M-layer has a thickness of 200 nanometers (nm)±20 percent (%) and said second M-layer has a thickness of 300 nm±20%.

* * * * *